United States Patent [19]

Rougeot

[11] 4,229,736
[45] Oct. 21, 1980

[54] SEMICONDUCTOR DISPLAY APPARATUS
[75] Inventor: Henri Rougeot, Paris, France
[73] Assignee: Thomson-CSF, Paris, France
[21] Appl. No.: 822,637
[22] Filed: Aug. 8, 1977
[30] Foreign Application Priority Data
  Aug. 10, 1976 [FR] France ............................... 76 24389
[51] Int. Cl.² .............................................. G06F 3/14
[52] U.S. Cl. .................................... 340/782; 340/761;
  357/55; 340/718
[58] Field of Search .................. 340/324 M, 336, 760,
  340/761, 766, 782, 718; 357/55

[56] References Cited
U.S. PATENT DOCUMENTS

| | | | |
|---|---|---|---|
| 3,678,573 | 7/1972 | Driver | 357/55 |
| 3,689,392 | 9/1972 | Sandera | 357/55 |
| 3,914,758 | 10/1975 | Ingle | 340/793 |
| 3,940,756 | 2/1976 | Findlay | 340/324 M |
| 3,947,840 | 3/1976 | Craford | 340/324 M |

Primary Examiner—Marshall M. Curtis
Attorney, Agent, or Firm—Roland Plottel

[57] ABSTRACT

A display apparatus having a matrix (4) of semiconductor parts (42) acting both as memories and as amplifiers, and which is driven by two grids of electrodes that are parallel respectively to the lines (L) and to the columns (C) of the matrix (4). Actuation means (6, 7, 8) permits one line of the matrix to be selectively actuated to receive the information to be entered in each part on that line. Electrical signal from each semiconductor part (42) of the given line represents the information that is stored and that signal is displayed in an electroluminescent layer of diodes (3) in the apparatus. The apparatus may be used to display television images.

7 Claims, 6 Drawing Figures

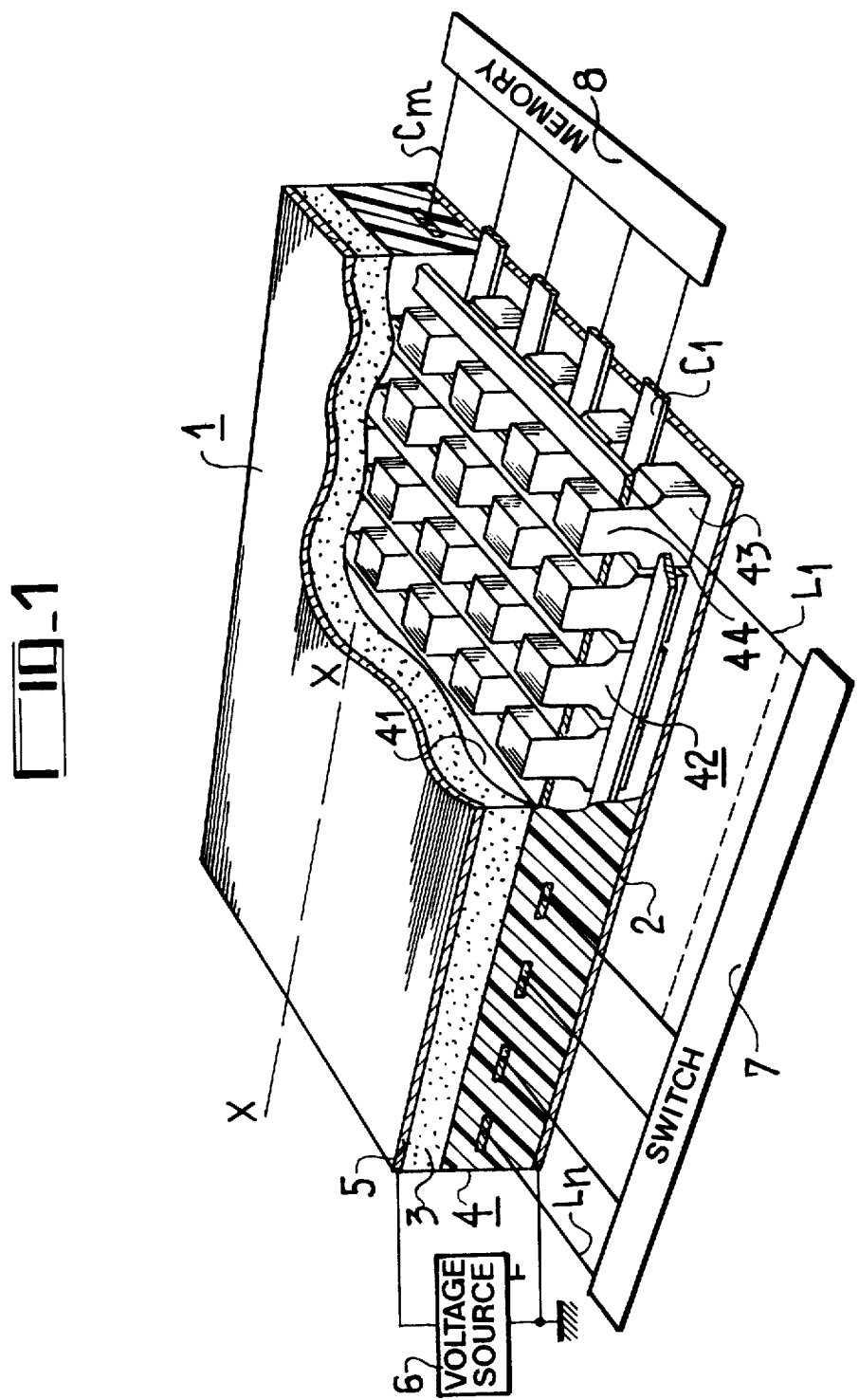

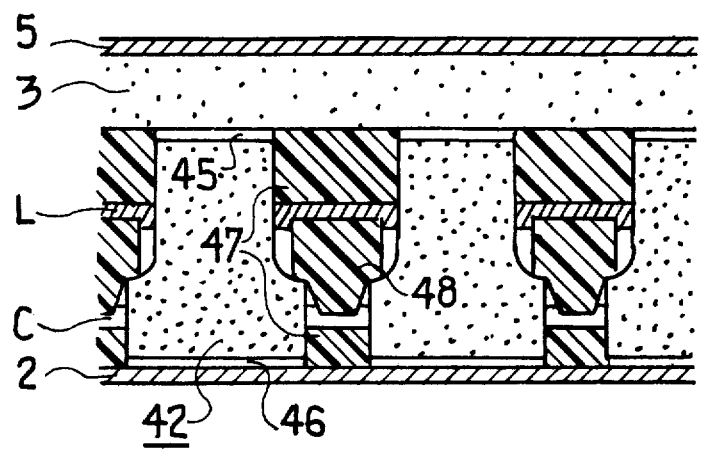
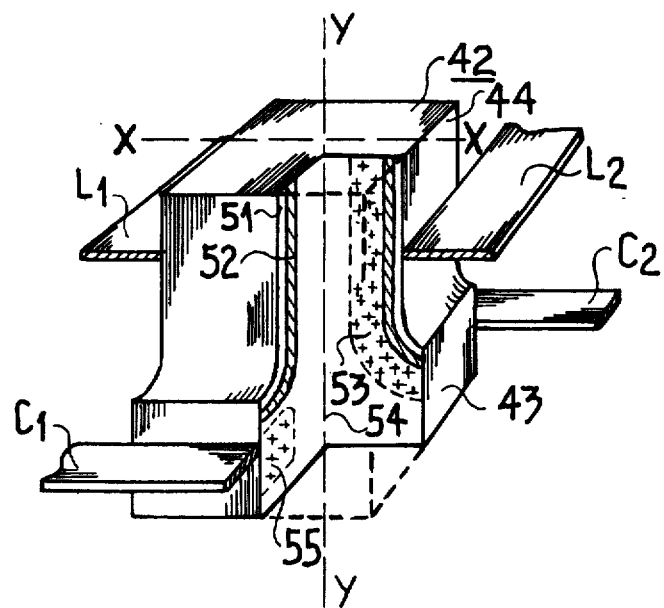

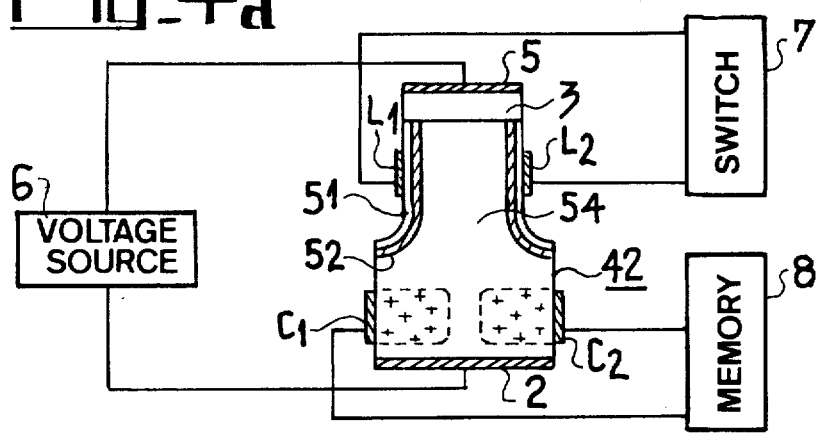
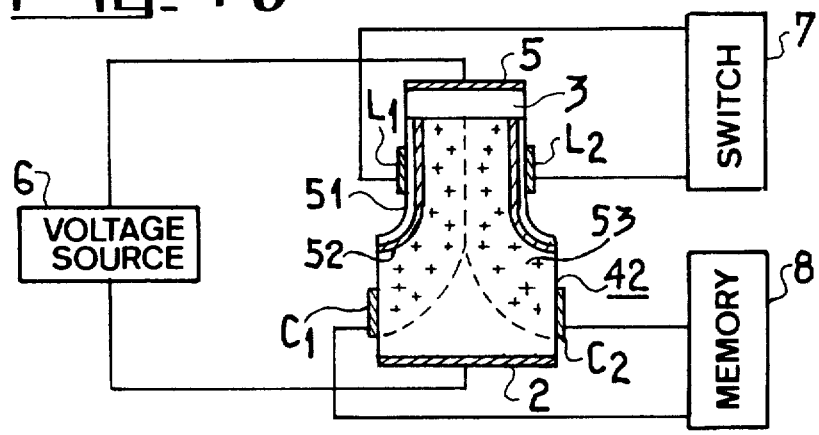
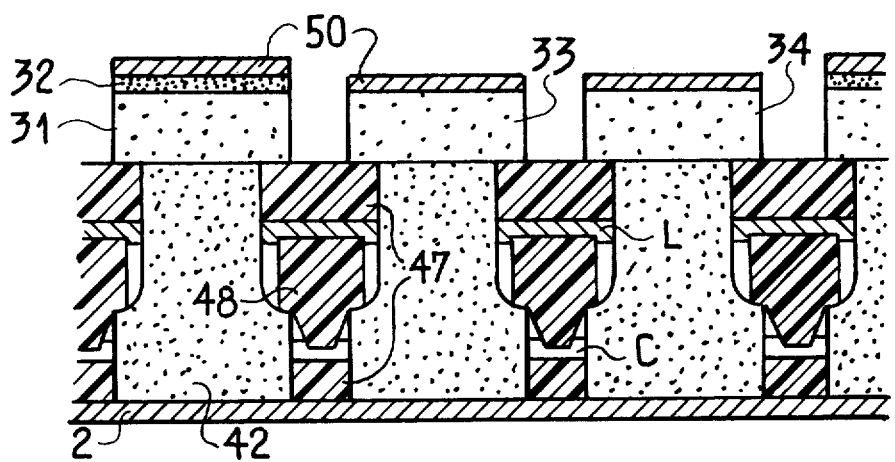

SEMICONDUCTOR DISPLAY APPARATUS

The invention relates generally to displays and particularly to semiconductor apparatus for visually displaying information contained in electrical signals.

The apparati most often used for such a display, e.g., the display of television signals are cathode ray tubes where the information to be displayed modulates an electron beam which subsequently hits a luminescent screen. The two greatest inconveniences of these tubes are their substantial bulk and that they require a vacuum.

The present invention is an apparatus of reduced size which displays electric information, digital data or television images.

According to one aspect of the invention there is provided an apparatus for displaying an electrical signal having: a matrix of semiconductor parts, arranged in lines and columns for memorization and amplification of said electrical signal; two command grids joined to said matrix, having electrodes parallel respectively to said lines and to said columns, and in contact with the said semiconductor parts; actuation means connected to the first of said grid, which has its electrodes parallel to the said lines for the selective activation of the lines of the said matrix; memory means for receiving said electrical signal, connected in parallel to the electrodes of the second of said grids and for transferring its contents to an activated line of said matrix, the semiconductor parts of the said activated line would then each store a second electrical signal representing the said electrical signal; display layer means adjacent one extremity of said semiconductor parts for displaying the electrical signals from said semiconductor parts; and means for applying a potential across the display layer and the extremities of each of the semiconductor parts.

These and other functions, characteristics, and results of the invention are set forth in the following description which is given as a non-exhaustive example and is illustrated by the annexed drawing in which:

FIG. 1 is a schematic perspective view partially in section of one embodiment of the apparatus of the invention.

FIG. 2 is a cross sectional side view of the apparatus of FIG. 1.

FIG. 3 is a three dimensional representation of a semiconductor part used in the apparatus of the invention.

FIGS. 4a and 4b are diagrams illustrating different phases of the workings of the semiconductor part represented in FIG. 3.

FIG. 5 is a side view of another embodiment of the apparatus of the invention adapted for a color display.

In all these illustrations, the same reference numbers are used throughout.

FIG. 1 is a three dimensional cut-away representation of the apparatus according to the invention. The apparatus is shown as a flat panel 1 and contains electronic control circuits and input or feeding systems around the periphery of the panel.

The panel 1 is composed successively (from top to bottom in FIG. 1) of: a transparent plane electrode 5; a display layer 3 or output screen which provides light in accordance with an applied electric signal; this layer typically contains light emissive diodes disposed in an ordered mosaic or at random; a layer 4 which contains an orderly matrix of semiconductor parts 42; and a second plane electrode 2.

The semiconductor parts 42 typically have a parallelepipedal shape. They are separated from each other by two series of parallel electrodes called column electrodes $C_1, \ldots, C_n$ parallel to an XX axis, and line electrodes $L_1, \ldots, L_n$ parallel to an axis perpendicular to the XX axis. The parts 42 can have the particular configuration shown in the drawings, i.e., they can be composed of two superimposed parallelepipeds of different thicknesses:—the upper portion 44 being narrow and in contact with the line electrodes L, and the lower portion 43 being wider and in contact with the column electrodes C. The line electrodes L and the column electrodes C constitute two distinct command grids. The parts 42 and the C and L electrodes are in an opaque isolating material 41.

The apparatus also has electronic control circuits and feeding or input system such as:—a voltage V source 6 connected between the electrode 2 and the electrode 5; a change-over switching device 7 to which each of the electrodes $L_1, \ldots, L_n$ is connected in parallel, which can be, for example, a charge transfer shift register of the BBD (bucket brigade device) type; and a memory 8 to which each of the electrodes $C_1, \ldots, C_n$ is connected in parallel.

FIG. 2 represents a side view of the apparatus according to the invention. The view is along a plane parallel to the XX axis of the preceding figure.

Here there is again shown the successively arranged transparent electrode 5; the display layer 3; the mosaic of parts 42; and the electrode 2.

On this figure a method of carrying out the insulation between the parts 42 is illustrated. The parts are separated from each other by a spacer 48 that holds the C and L electrodes, in contact with the surface of the parts 42. The insulation is completed by an opaque material 47 which separates the C and L electrodes from the electrode 2 and the layer 3 respectively.

The parts 42 are composed, for example, of n type silicon. Each surface to be brought into contact with the electrode 2 and with the layer 3 may be doped n+ in order to facilitate the ohmic contact. (Zones 46 and 45 respectively).

FIG. 3 represents a three dimensional view of the semiconductor part 42 and its associated control grids, and illustrates its workings.

The part 42 has two portions: an upper portion 44 whose two lateral faces are in contact with the line electrodes $L_1$ and $L_2$ (perpendicular to the XX axis) and a lower portion 43 of greater cross section whose two lateral faces are in contact with the column electrodes $C_1$ and $C_2$.

The lateral peripheral portion of the upper portion of the part 42 is covered by a layer of insulation 51 that is for example an oxide layer. Below (or further in from) the layer 51 is a doped layer 52 (e.g., a type p diffused layer if the part 42 is of n type). The layer 52 is hereinafter called a floating grid. The presence of layer 52 creates a space charge zone 53 or depletion zone, whose area is a function of the charge of the floating grid 52. In addition, the space charge 53 lets a channel 54 remain only in the central portion of the upper position of the part 42.

The lower portion 43 contains neither an oxide layer, nor a doped (e.g., p) layer. The presence of the electrodes C creates a space charge zone 55 which limits the lower portion of the channel 54 at the center of the part 42.

The operating conditions of such a part are the following: a certain quantity of negative charges have been stored in the floating grid 52 during a previous memorization phase (this is described below). This quantity of charge represents a memorized S signal; this negative charge determines the area of the space charge zone 53 and thus the width of the conducting channel 54. One must remember that a voltage V (source 6 on FIG. 1) is applied between the extremities of the channel 54 through a portion of the display layer 3 via the electrodes 2 and 5. A current controlled by the width of the channel 54 will therefore pass through the display layer 3, and the brightness of the layers at each point is thus a function of the quantity of charges stored in the floating grids 52 of the various semiconductor parts 42, and thus of the electrical signal S applied to (and memorized by) these parts 42.

The parts 42 therefore carry out, in this manner, an amplification function.

In this phase of operation the column electrodes C are maintained at a potential such that the space charge zones 55 that they create do not introduce an extra constriction of the channel 54.

FIGS. 4a and 4b are simplified diagrams illustrating memorization or write-in of resetting of the semiconductors 42. To facilitate the drawing the electrodes L and C which are, in reality, in contact with the parts 42 in different planes, have been represented here in the same plane.

Referring now to FIG. 4a:—to put a signal S into memory in a part 42, one proceeds as follows. Signal S is contained in the memory 8 which is connected in parallel to all the electrodes C of the apparatus (FIG. 1). One of the lines of the apparatus is selected with the aid of the switch 7 that permits application of a positive voltage (in relation to the mass of the semiconductor 42) to the electrodes L of the selected line. This positive voltage is reflected by capacitive effect onto the floating grid 52 and makes the space charge zone (53 on FIG. 3) disappear. Simultaneously, the C electrodes receive a (negative) signal from the memory 8. The amplitude of this signal represents the signal S to be memorized, and creates a space charge zone 55 which is a function of the amplitude of the signal S and which permits the control of the flow of electrons furnished by the source 6 (through the intermediacy of the electrode 2) towards the floating grid 52. The former therefore becomes negatively charged as a function of the S signal.

After the floating grid 52 is charged, the voltage applied to the electrodes L is brought back to its initial value. Thus, there develops a space charge zone (53 on FIG. 3) whose area is proportional to the charge of the floating grid 52 and which controls the current that flows through the display layer 3 and thus its brilliance as described above.

One must note that in practice, the recording impulse applied to the electrodes C must last slightly longer than the switch impulse applied to the electrodes L.

FIG. 4b illustrates the process of resetting a part 42 to zero, a process that is done immediately prior to the memorization phase.

During this phase, a negative voltage is applied to the line electrodes L by the switch 7 while the column electrodes C are maintained at a null voltage (ground). The result is that the space charge zone 53 created by the electrodes L stretches out over the entire width of the part 42 and completely blocks the central channel. The electrodes C and the semiconductor 42 can then be viewed as Schottky diodes polarized in the forward direction, realizing an injection of positive charges towards the floating grid 52 which results in resetting the part 42 to zero, regardless of the former charged state of its floating grid.

With regard to the functioning of the apparatus as a whole, reference is made again to FIG. 1.

The information to be displayed is introduced into the matrix 4 line by line, all the parts 42 of one particular line being energized simultaneously. For example, in a first phase, one of the line electrodes $L_i$ is polarized negatively (to reset the parts 42 of that line to zero). This is done by the switch 7. In a second phase, one line of information is entered into the memory 8 and the switch 7 ensures the application of a positive voltage to the line electrodes $L_i$ so that the contents of the memory 8 are transferred to the semiconductor parts 42 according to the process described in FIG. 4a. The signal originally contained in the memory 8 is then displayed at the level of the parts 42 of the activated line $L_i$ as is explained in FIG. 3.

As for the other lines, not selected, the information they contain and that they display is not modified by the signals present on the column electrodes C, if their amplitude is maintained at a sufficiently weak level so that the length of the central canal of each part 42 not be modified as seen in FIG. 3.

One method of building the apparatus according to the invention is as follows.

One uses for the parts 42 a small n type semiconductor wafer about 1 millimeter thick which is sawed to a depth of several hundred microns at 600 μm intervals on one surface, in order to form the upper portion of the parts 42. The small wafer is then submitted to a p diffusion, e.g., in an atmosphere of boron (to make the floating grid 52) and then the oxidation layer 51 is formed. After masking the upper face (e.g., region 51) and removing any oxide from the upper and lower faces, the wafer is then subjected to a type n+ diffusion of phosphorus for instance to form layers 45 and 46 on FIG. 2. The wafer is finally cut into parts 42, e.g., with the aid of a laser beam. The final dimensions of the parts 42 may be as follows: side of the lower cross section: 500 μm; side of the upper cross-section: 300 μm; height of the lower portion: 250 μm; total height: 750 μm.

The parts 42 are placed in the openings of the spacer 48 (FIG. 2), e.g., by flotation in a viscous liquid: the parts 42 having previously been covered (before cutting) with a non-wetting substance in order to maintain the upper face of the portion 44 at the surface of the liquid.

The rest of the fabrication includes:—metalization (e.g., an electrolytic growth of metallic deposits) in the shape of combs on the two faces of the spacer 48 in order to make the C and L electrode mesh; application of the opaque insulator 47; deposition of the electrode 2; the deposit through sedimentation of a layer of electroluminescent diodes (they may be oriented in sedimentation liquid by the wetting technique just described in order to have the p part towards the top); and the deposit of the electrode 5 on this last layer.

A similar but alternative version of manufacturing is depositing the electroluminescent diodes on the semiconductor plate before cutting.

FIG. 5 represents a side view of the apparatus according to the invention, in the case of a color display. This figure is similar to FIG. 2 and there is shown common elements of FIG. 2, namely:—the semiconductor parts 42; the spacer 48; the L and C electrodes; the insulator 47; and the electrode 2.

The layer 3 of FIG. 2 is replaced by individual or point structures or stripe structures which emit light respectively in the blue, the green, and the red. More precisely one of three parts 42 emits blue light thanks to a layer of AsGa 31 topped with blue phosphorus 32. The following part 42 is covered by a layer 33 of electroluminescent diodes which emit in the green; and the third part 42 is covered by a layer 34 which emits in the red.

The plane electrode 5 of FIG. 2 is replaced by transparent conductive hands 50 connecting the parts 42 which emit in the same color.

The operation of such an apparatus is analogous to what has been previously described.

I claim:

1. An analog apparatus for displaying an electrical signal in which the brightness of each part of the display is proportional to the amplitude of the signal comprising a matrix of semiconductor parts, arranged in lines and columns for memorization and amplification of said analog electrical signal; two command grids joined to said matrix, having electrodes parallel respectively to said lines and to said columns, and in contact with the said semiconductor parts; actuation means connected to the first of said grid, which has its electrodes parallel to the said matrix; memory means for receiving said electrical signal, connected in parallel to the electrodes of the second of said grids and for transferring its contents to an activated line of said matrix, the semiconductor parts of the said activated line would then each store a second analog electrical signal proportional to the amplitude of said analog electrical signal and for controlling a flow of current therethrough in accordance with said store signal; display layer means adjacent one extremity of said semiconductor parts for displaying the electrical signals stored by the said semiconductor parts when a current flows through said parts and; means for applying a potential across the display layer and the extremities of each of the semiconductor parts, whereby causing a current flowing through each semiconductor part and the adjacent display layer to be proportional to the second electrical signal stored in the part, and the intensity of the display is proportional to that current.

2. An apparatus according to claim 1 wherein said display layer comprises electroluminescent diodes spread out in a random fashion over one of the surfaces of the semiconductor parts but oriented in a single direction of conduction.

3. An apparatus according to claim 1 wherein each of the said semiconductor parts is composed of two portions, the lower portion being in contact with the said second grid and the upper portion being in contact with said first grid through a doped layer whose conductivity is opposite to that of the semiconductor body, and by a layer of insulation which covers said doped layer.

4. An apparatus according to claim 3 wherein each of said two portions is shaped roughly as a parallelepiped, the upper portion being of smaller cross-section than the lower portion.

5. An apparatus according to claim 3 wherein the memorization of an analog signal in one of the semiconductor parts is carried out by applying a first voltage to the first command grid with a polarity and amplitude such that the space charge zone created by the doped layer disappears, and a second voltage to the second command grid of opposite polarity whose amplitude represents the information to be displayed.

6. An apparatus according to claim 3 wherein the zero resetting of one of the semiconductor parts is carried out by applying a voltage to the first command grid, with a polarity and amplitude such that the space charge zone associated with said doped layer occupies substantially the entire area of the semiconductor part, and the second command grid being maintained at a reference voltage.

7. An apparatus according to claim 1 wherein said display layer is divided into alternating sets emitting respectively in blue, red and green.

* * * * *